US009124295B2

(12) United States Patent
Dupont

(10) Patent No.: US 9,124,295 B2
(45) Date of Patent: Sep. 1, 2015

(54) SYSTEM AND METHOD FOR DATA COMPRESSION AND TRANSMISSION

(71) Applicant: Nicolas Thomas Mathieu Dupont, Orlando, FL (US)

(72) Inventor: Nicolas Thomas Mathieu Dupont, Orlando, FL (US)

( * ) Notice: Subject to any disclaimer, the term of this patent is extended or adjusted under 35 U.S.C. 154(b) by 0 days.

(21) Appl. No.: 14/080,248

(22) Filed: Nov. 14, 2013

(65) Prior Publication Data

US 2015/0130645 A1    May 14, 2015

(51) Int. Cl.
*H03M 7/00* (2006.01)
*H03M 7/30* (2006.01)
*H03M 7/42* (2006.01)

(52) U.S. Cl.
CPC .............. *H03M 7/6029* (2013.01); *H03M 7/42* (2013.01)

(58) Field of Classification Search
CPC ............................... H03M 7/6029; H03M 7/42
USPC ............................ 341/50, 51, 106, 67, 65, 60
See application file for complete search history.

(56) References Cited

U.S. PATENT DOCUMENTS

| | | | |
|---|---|---|---|
| 5,442,350 A * | 8/1995 | Iyer et al. .......................... 341/51 |
| 5,633,631 A | 5/1997 | Teckman |
| 5,983,289 A * | 11/1999 | Ishikawa et al. ................. 710/35 |
| 6,353,908 B1 * | 3/2002 | Heinrich ......................... 714/748 |
| 6,563,442 B1 * | 5/2003 | Luna et al. ....................... 341/106 |
| 6,956,511 B2 | 10/2005 | Thomas et al. |
| 6,987,468 B1 * | 1/2006 | Malvar ............................. 341/59 |
| 8,463,944 B2 * | 6/2013 | Bansal et al. ................... 709/248 |
| 8,610,605 B2 * | 12/2013 | Froemmgen .................... 341/59 |
| 2008/0272939 A1 | 11/2008 | Cameron |
| 2013/0181851 A1 * | 7/2013 | Kataoka ........................... 341/52 |

FOREIGN PATENT DOCUMENTS

WO    WO0004681 A1    1/2000

* cited by examiner

*Primary Examiner* — Peguy Jean Pierre
(74) *Attorney, Agent, or Firm* — Shanti M. Hill, Esq.; Beusse Wolter Sanks & Maire, PLLC

(57) ABSTRACT

A system, method, and apparatus for compressing binary code comprising at least a processor, memory, storage, and an encoding device or decoding device or both. The methods include comparing a given binary code string having a certain size to be compressed or decompressed with a table comprising all possible combinations of zeroes and ones for any binary data of size x. The given binary code string and all possible combinations are partitioned in packets of size y and each packet assigned a value. A second value representing an assembly of all the values into a second value is performed. The assembly may be performed n times to obtain an nth value. The second or nth value is transmitted or received or both by the encoding and decoding devices, respectively, in place of the given binary code. Table comparison may be performed using pattern recognition.

15 Claims, 13 Drawing Sheets

Figure 9

| Column A | Column B | Column C | Column D |
|---|---|---|---|
| Original (8 bit example, 256 possible combinations) | Packaged | Coefficient | Value |
| 00000000 | 00.00.00.00 | 0000 | 1 |
| 00000001 | 00.00.00.01 | 0001 | 2 |
| 00000010 | 00.00.00.10 | 0002 | 3 |
| 00000011 | 00.00.00.11 | 0003 | 4 |
| 00000100 | 00.00.01.00 | 0010 | 5 |
| 00000101 | 00.00.01.01 | 0011 | 6 |
| 00000110 | 00.00.01.10 | 0012 | 7 |
| 00000111 | 00.00.01.11 | 0013 | 8 |
| 00001000 | 00.00.10.00 | 0020 | 9 |
| ...through pattern 256 | ... | ... | ... |

SYSTEM AND METHOD FOR DATA COMPRESSION AND TRANSMISSION

FIELD OF THE INVENTION

The present invention relates generally to the field of devices to facilitate data packaging and compression.

COPYRIGHT

Copyright—A portion of the disclosure of this document contains material that is subject to copyright protection. The copyright owner has no objection to the facsimile reproduction by anyone of the patent document or the patent disclosure, as it appears in publically available Patent and Trademark Office patent files or records, but otherwise reserves all copyright rights whatsoever. The following notice applies to the software, data, and/or screenshots which may be described below and in the drawings that form a part of this document: Copyright Nicolas T.M. Dupont, All Rights Reserved.

BACKGROUND

Data compression is basically a process by which data, which has been processed from raw data, is reduced in size. Compression, as its name implies, is the processing of an input source and conversion into another, smaller digital representation of the original. The compressed data then must be reconstructed. If the source and the reconstructed contents match exactly, the method is said to be lossless, otherwise it is considered lossy. Lossy compression allows for a construction of an approximation of the original data and usually obtains higher compression ratios than lossless schemes, however at the expense of quality.

Lossy compression is used mainly for most video, audio, and images. For these types of files, lossless compression is not used efficiently because the data is already in a space saving format output from the original device (ex., a camera). Lossy compression is therefore used on these types of files if a user wants more space saving. Used in video compression, for example, high quality lossy compression works by dropping video colors a person cannot see in the color spectrum. However, as the video file continues to be compressed, this results in a lower bit rate; consequently, the quality of the image will worsen due to the missing pixels. Another example of a format that uses lossy compression is JPEG, one of the most commonly used image formats. When you save an image in JPEG format, the user may choose the quality of the output. The finer the quality, the more space it will consume. Another example of a lossy compression file format is the MP3 format for audio files. When a user saves or exports this type of file, he or she chooses a bit depth for the file, analogous to image quality with JPEG files. The bit depth is the precision of the sound. The higher the bit depth, the more storage space the file will require. Even when choosing a large bit depth, any compression will still result in a loss of magnitude and ampler.

The principal limitation of lossy compression therefore is the tradeoff between size and bandwidth. In the case of video, the tradeoff is the speed in which the video is streamed and the video's quality.

An example of a lossless data compression format is the zip format. In this format, a user choses a file he or she wishes to compress and the file is compressed using compression algorithms. The zip format uses an algorithm rather than a compression key and shrinks the file to a compressed file size.

Current methods for data compression require knowledge of the information contained in a data file in order to remove redundancy in the data file. Compression schemes such as the zip format creates codecs which work on the application layer, not the physical layer (pure binary). For instance, a certain pixel or character (8 bit character, such as the letter "A") can be given a code in arithmetic coding schemes such that the file can be compressed by replacing codes for certain characters or file parts. This is why there are various compression schemes for differing file types—because current compression systems require knowledge of the file's components in order to determine what will be redundant in the file (and therefore eliminated such that a compressed file can be generated). As a result, these systems can be very complex.

For instance, incoming binary code for an image is translated such that it is seen as an image with characteristics, such as pixels. After this interpretation, current compression schemes then operate on the file or folder. Previous compression systems will work, for example, by removing certain pixels and adding more noise to the image or overall quality of the image. Then, the processed image is assigned a new string of binary code, which is considered the compressed file. Compression of images or videos by these schemes can require complex algorithms and systems for determining which pixels may be redundant and therefore "eliminated" in a compressed file. Or, for example Huffman coding can be used to compress a text file, among other file types. The premise of this coding is that characters which repeat most often (for instance a space) are assigned a much shorter code of bits, so that when translated for transmission, the whole file is much shorter. Basically, the way these systems work is that they require knowledge of what the raw data stands for in order to decide what can be removed from a file for the purpose of compression.

Knowledge of data content for compression is seen in image compression, for example, when data is analyzed for statistical redundancy. For example, an image may have areas of color that do not change over several pixels; instead of coding each individual repeated pixel, the data may be encoded as "X number of red pixels." Because a pixel is 16 bits, the analysis of the redundant pixels must therefore occur on the application layer, so to speak. Similarly, in the case of video, current compression schemes will see a video file and what it stands for. These compression systems may take into account such things as image quality and video size. Regarding the determination of statistical redundancy above, probability tables are sometimes used for the purpose of analyzing the probability that bit sequences down the string of a binary code may stand for something, for instance a pixel or certain character. There are several examples, but one is the use of probability schemes to determine if there is a high chance a certain upcoming byte (8 bit bit-pattern) will stand for something redundant, for example, the character (a byte) may be removed (or, in the case of an image pixel, a 16 bit section may be removed). Then this analyzed data may then be compressed so that redundant bytes are removed (or in the case of when an image pixel removed, a two byte string is removed) and then a new binary string is assigned to represent the original file. This new binary string is the compressed file which is transmitted. The probability schemes aim to ensure that the compressed file may be decompressed such that it is a close approximation of the original.

In the above example, the statistical apparatus of these systems are based solely on the type of data to be compressed, i.e., video or audio. Current compression systems do not operate on raw binary to compress simply a string of zeroes and ones. Instead, as alluded to above, these systems require an analysis of what the binary represents (the "data") in order to compress the raw binary behind the data (meaning, operating from the standpoint of the application layer). The JPEG scheme, for example, does not simply take out zeroes and ones from the image's original binary code irrespective of what that bit might stand for.

Because different data types will have different properties in terms of what will be statistically redundant, current compression schemes are different for different data types. Images, text, audio or video will have different properties. For instance, while spaces may be most prevalent in a given text, certain colors might be most prevalent in an image. Therefore, those redundancies are handled differently based on the data type. Also, what is removed from a given original file is removed only after intelligent, and many times complex, analysis of redundancy in the original data.

The background description provided herein is for the purpose of generally presenting the context of the disclosure. To the extent that work of the inventor hereof is described in this background section, as well as aspects of the invention that may not otherwise qualify as prior art at the time of filing, they are neither expressly nor impliedly admitted as prior art against the present disclosure.

SUMMARY

Methods, systems, and apparatus, including computer program products (referred to collectively for convenience as the "system") are disclosed for compressing data irrespective of data type. In one embodiment, disclosed is a method and system for compressing binary code irrespective of data type. The system may also include decompression in a parallel decoding scheme. In one aspect, disclosed is a system which improves the traditional eight-bit binary system of data packaging for receipt and transmission, while at the same time is fully interoperable with existing systems/terminals which use binary. In yet another embodiment, a method is disclosed for compressing or decompressing data, or both, using a simple, homogenous algorithm for all data types.

The preferred embodiment of the system comprises a decoding device or encoding device, or both in communication, where the encoding device and decoding device include architecture for performing the methods described herein. The encoding device preferably comprises at least a processor, storage, memory, and a chip upon which firmware is embodied to perform the compression method, the method comprising packaging binary data in two bit packets and performing, either simultaneously or following packaging, pattern recognition on the binary data for comparison with pre-generated compression key tables, where the pre-generated compression key tables are generated also using the two bit packaging scheme. In the embodiment comprising both an encoding and decoding device in communication, the decoding device has a parallel architecture as the encoding device. Communication between an encoding device and the decoding device may be wireless data transfer as well as transfer through a physical connection, such as an optical fiber.

As described in detail in the Detailed Description (the content of which is considered part of this Summary), for a given file to be compressed, it is compared to a preferably self-generating table to compare its bit pattern, in two bit packets, to its corresponding compression key. From there, the compression key is used to call a value representing a shorter code for the original file. This value is then recast as a new, compressed string of binary code. In contrast to the methods presented in the Background above, the present system's combination and implementation of data packaging techniques, pattern recognition, and compression key generation/use allows for a file's binary code to be compressed regardless of data type (data "type" could be for example, text file, video, audio, image, etc.) and regardless of the arrangement of the binary code. The system takes into account the untranslated binary code, regardless of what the binary stands for.

In one embodiment, the system comprises firmware embodied on a chip which operates to compress binary code and substitute a smaller size binary string to stand for the original data's binary code. The compressed binary is then transmitted by the transmitting terminal (via flashes, for example in an optical fiber) to a receiving terminal. When the compressed binary arrives at the receiving terminal, it is decoded (preferably using corresponding chips/firmware which are loaded on the receiving terminal) back into its original binary form. From there, the terminal's operating system decodes the compressed binary into its original data form, to be read and utilized by various applications.

Variations are possible by those skilled in the art and are contemplated by this disclosure. For instance, as mentioned above, data compression in the art consists of removing redundancy in the actual data file (in other words, requires a look at the actual information contained in the data). The disclosed system and method may compress any binary, including binary strings generated by other compression schemes. In addition, although the preferred embodiment packages data in two bit packets, any other sized packet may be used.

BRIEF DESCRIPTION OF THE DRAWINGS

FIG. 9 shows an exemplar assignment of a coefficient to each two-bit packets and the subsequent assignment of a second value to the coefficient string in accordance with an embodiment.

DETAILED DESCRIPTION

Figure 1:
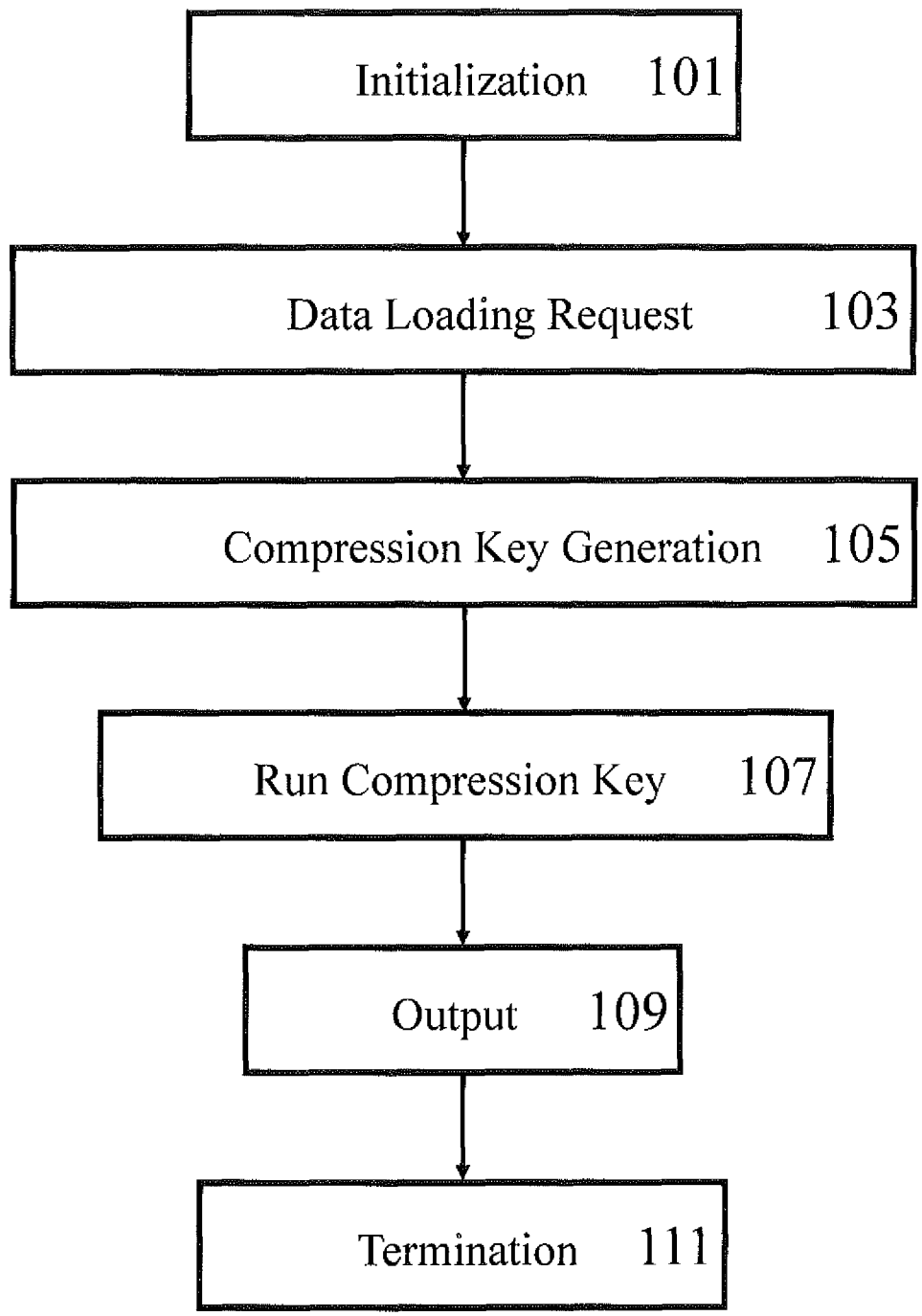
FIG. 1 is an embodiment of the data compression system and method.

Disclosed is a system and method for improving data transfer rates (referred to collectively as the "system"). In one aspect of the invention, a method is disclosed for compressing binary code thereby enabling faster data transmission. In another aspect, the system comprises both an encoding and decoding device, for the purpose of compressing and decompressing data, respectively, according to the data compression method disclosed. The system compresses pure binary code. Because of this, the compression method operates to compress data irrespective of the type of data. There are currently no compression systems that compress data based on pure binary code.

In one embodiment, disclosed is a system which assigns values to all arrangements of binary code possible for a particular file size and transmits the code instead of the file. This is done by packaging the binary into preferably two-bit packets, assigning values to those two bit packets, and then using that code to generate compression keys. The compression keys are then used to translate an uncompressed file into a compressed file—and vice versa on a parallel decompression.

This system is an improvement in the efficiency of compression because it considerably simplifies the process of compression. One of the simplifications is that this system compresses pure binary code, regardless of what the code stands for. Previous systems compress data based on the content of the data—in other words what the raw binary code stands for (example, removing redundant pixels in an image file). This is the distinction between the physical versus application layer compression. There are no known compression schemes which work on the physical layer. Because this is a physical layer compression scheme, the system is a cleaner and much more efficient process for compressing data.

Although the disclosure involves something most akin to "data compression" or "compression" (and so for convenience, that terminology is used), one difference is that the method disclosed involves the manner in which the binary code is handled as well as a mode of compression (and subsequent decompression) of the data itself. "Data" in this disclosure shall refer to translated data—binary that has been translated into a form that is readable by an operating system. Data may therefore be a file, such as an image or a video. "Raw data" refers to herein as untranslated data—a binary string.

The binary code which may be compressed by the disclosed system may be of any type of data file (image, audio, or any other format of data). Because this system does not look at the "data," but instead looks at the raw binary code when compressing in order to compress the raw binary, it is a much simpler and more efficient manner of compression. For instance, previous compression of images required complex algorithms and systems for determining which pixels may be redundant and therefore "eliminated" in a compressed file. Or, for example, Huffman coding can be used to compress a text file, among other file types. The premise of this coding is that characters which repeat most often (for instance a space) are assigned a much shorter code of bits, so that when translated for transmission, the whole file is much shorter. Basically, the way these systems work is that they require knowledge of what the raw data stands for in order to decide what can be removed from a file for the purpose of compression. This system bypasses the complex undertaking of analyzing the content of a particular data (ex. what characters a particular byte sequence stands for) and operates only on the raw data.

Figure 12:
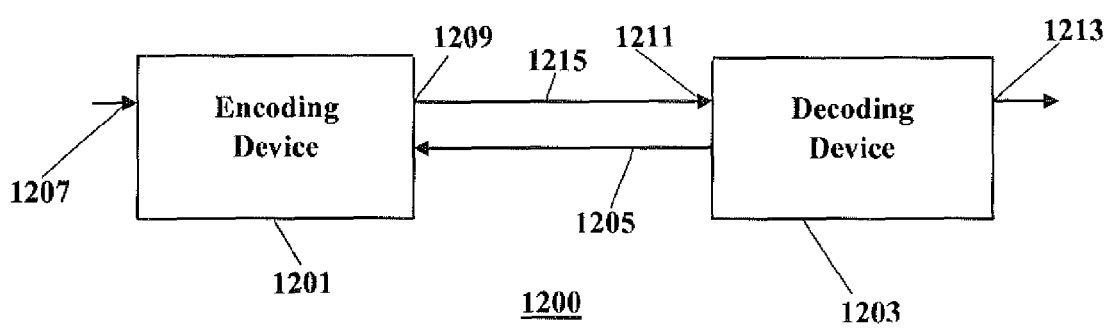
FIG. 12 shows the encoding device and the decoding device in communication in accordance with an embodiment.

FIG. 1 shows the basic method for packaging data to be transmitted in compressed formats for faster data transmission and the handling of data to be compressed in accordance with an embodiment. The method operates on data to be transmitted by an encoding device 1201 so that the quantity of bits transmitted is smaller than the number of bits in the original data file. In one embodiment, the system also comprises a parallel decompression as shown in FIG. 12. Data that is transmitted is received by decoding device 1203 and decompressed to represent the original file.

Figure 2:
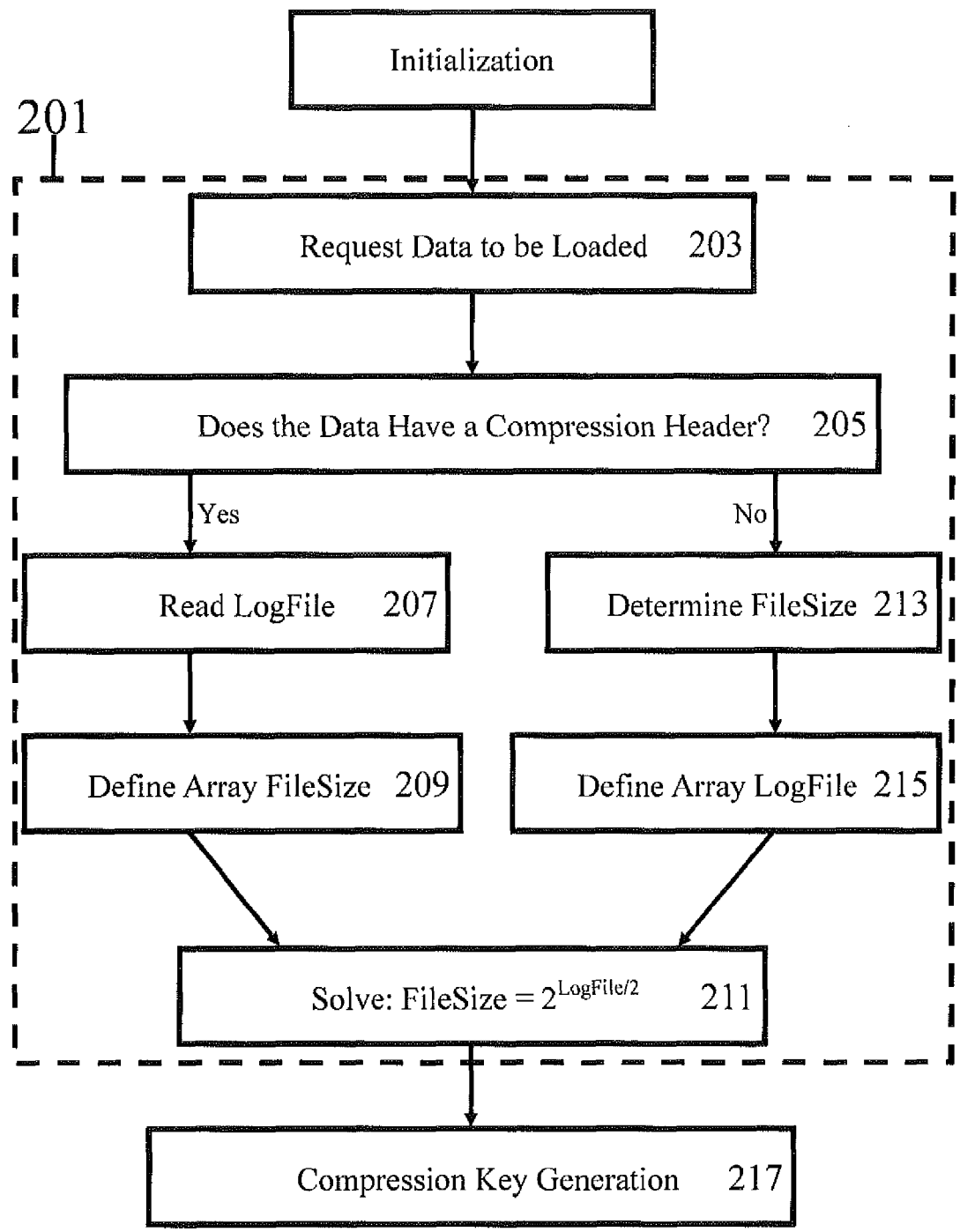
FIG. 2 shows a process for a data loading request in accordance with an embodiment.
Figure 10:
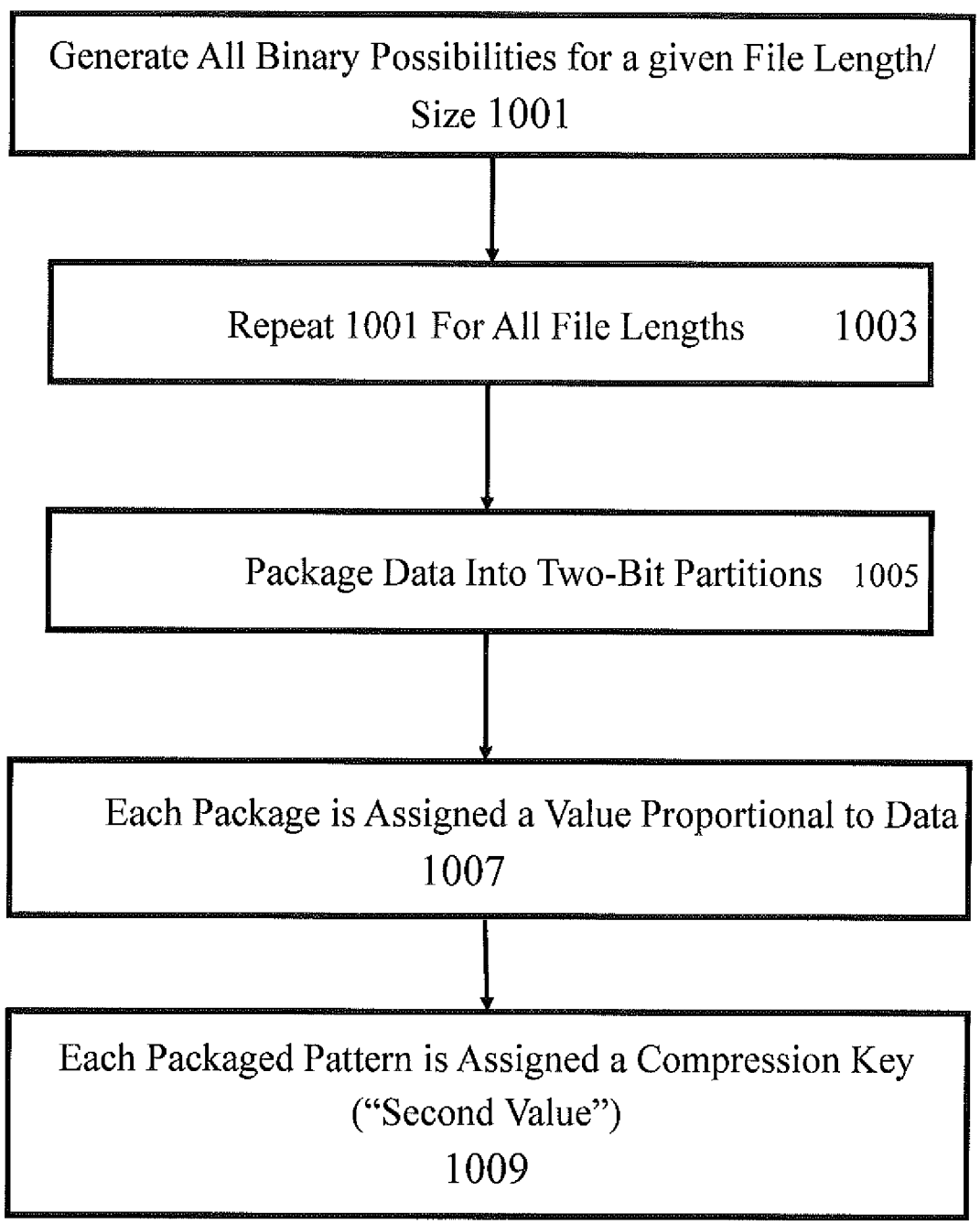
FIG. 10 shows an alternate view of the process of generating the compression key tables in accordance with an embodiment.
Figure 11:
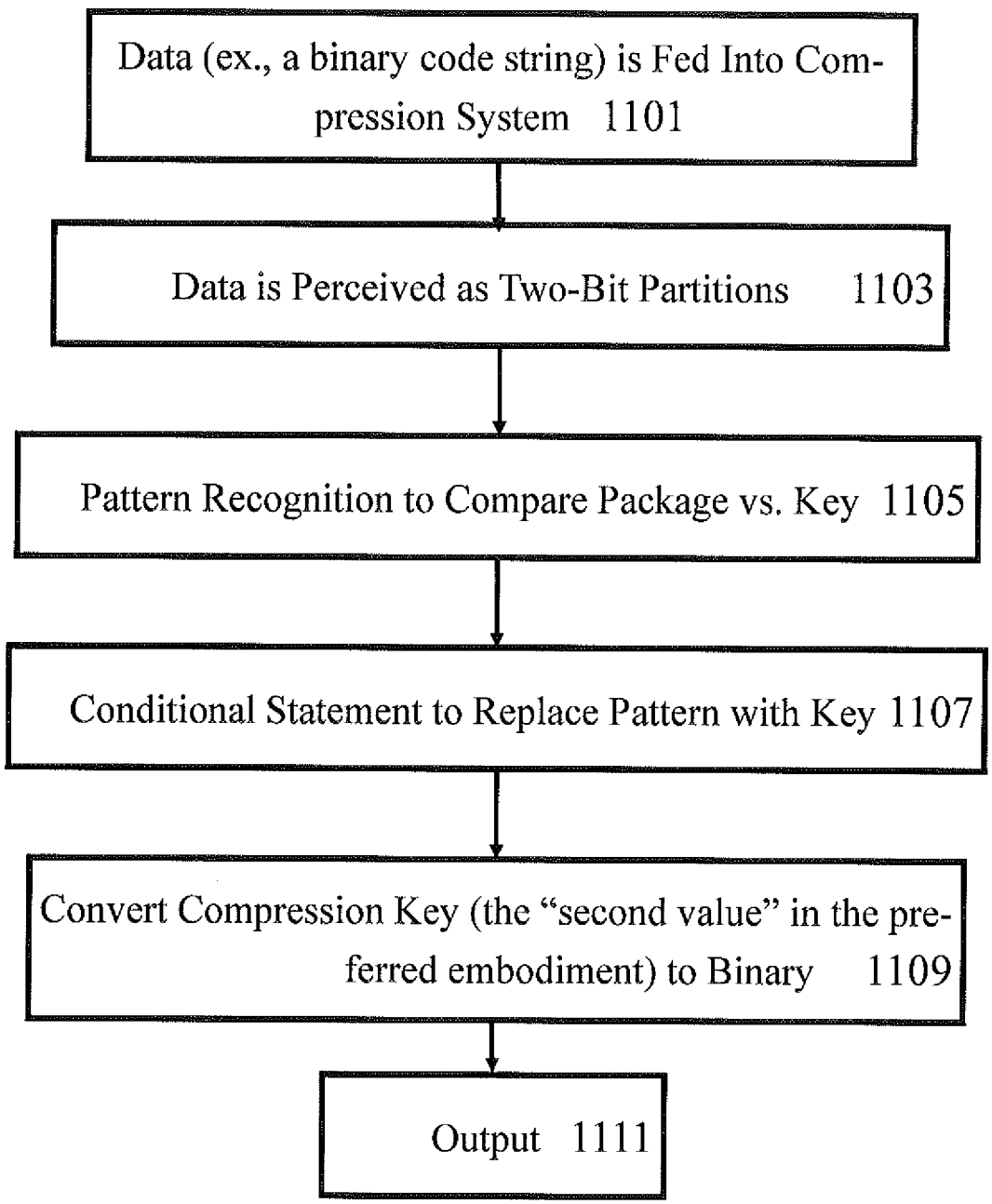
FIG. 11 shows an exemplar process for data compression in accordance with an embodiment.

The method can be seen as having two parts in an embodiment. One is the preparation of the compression keys to be used in data compression 101, 103, 105, and one is the actual compression of a data input 107, 109. FIGS. 3-5, 7 deal with the preparation of the compression keys to be used in compression. FIGS. 2, 6 and 8 deal with the handling of a given data to be compressed. FIGS. 10-11 are an alternative depiction of the system and methods described.

FIG. 1 shows an overarching preferred embodiment for the compression method to compress a given data. Implemented in a computerized device, Step 101 may be program instructions for the initialization, which is basically a header and for instructions to execute the method. This step may vary depending on the programmer and several initialization operations may be used. The next step may involve a data loading request 103 (explained further in FIG. 2) followed by a compression key generation 105. (Step 105 is further detailed in FIG. 3 at 301).

The next step involves the compression of actual input data; this is the running of the compression key 107. Initially, data must be received from an input source (not pictured). The data source could be from a data provider, data storage device, or other data source. Then the data must be compared with the appropriate table such that a compression key corresponding to the file may be generated.

The next step is output 109, 1209. For a compression, an instructions header is included in the compressed file to be output 109. The header file serves as a logfile to record how the data was compressed for the purpose of decoding/decompression; during decompression, the header will instruct the program to decode the compressed file such that the uncompressed data may be regenerated at the receiving location. Output 109 destination may be a storage device, a computing system, or other system that will store, process, or otherwise utilize the compressed data. Once data is outputted 109, for instance to the operating system, the program can terminate 111 and the script is over.

FIG. 2 shows a subprocess for handling incoming data 201. There are two paths or "sequences" shown. Sequence 203, 205, 213, 215, 211, 217 applies for incoming data that is not yet compressed in accordance with the methods herein (however, the incoming data may comprise data compressed from another compression scheme). Therefore, this data is the data to be encoded (compressed) by the encoding device. Although alternate flows are contemplated, one embodiment comprises a check of the incoming data file for a compression header 205. In this sequence, the file has not been compressed (in accordance with the method described herein), so the determination would be negative 205. If the outcome of determination 205 is negative, the size of the file is determined 213 and an array is defined called Logfile, to accept a value of Logfile based on the solving of equation 211. The equation FileSize=$2^{Logfile/2}$ 211 is then calculated as a check to ensure the original file is not corrupt, although other appropriate checksums may be employed.

Sequence 203, 205, 207, 209, 211, 217 applies for incoming data which is already compressed. In that scenario, data may be decompressed in a parallel running of the compression key to find the original data's counterpart to its compressed code. This operation is performed by the decoding device 1203. In this embodiment, there is a compression header including the variable LogFile, which was calculated and placed in the header of the compressed file by the encoding device 1201. If the file has a compression header, then Logfile is read 207 and an array defined, FileSize. 209. Then solve the equation FileSize=$2^{Logfile/2}$ 211 where FileSize is an array that can hold any amount of data. FileSize also refers to the size of the file to be compressed in bits or bytes. Logfile is a file that is created during compression and available all the way until the decompression serving as a "log" of the compression and is placed in the compression header. LogFile is variable based on the FileSize.

Figure 3:
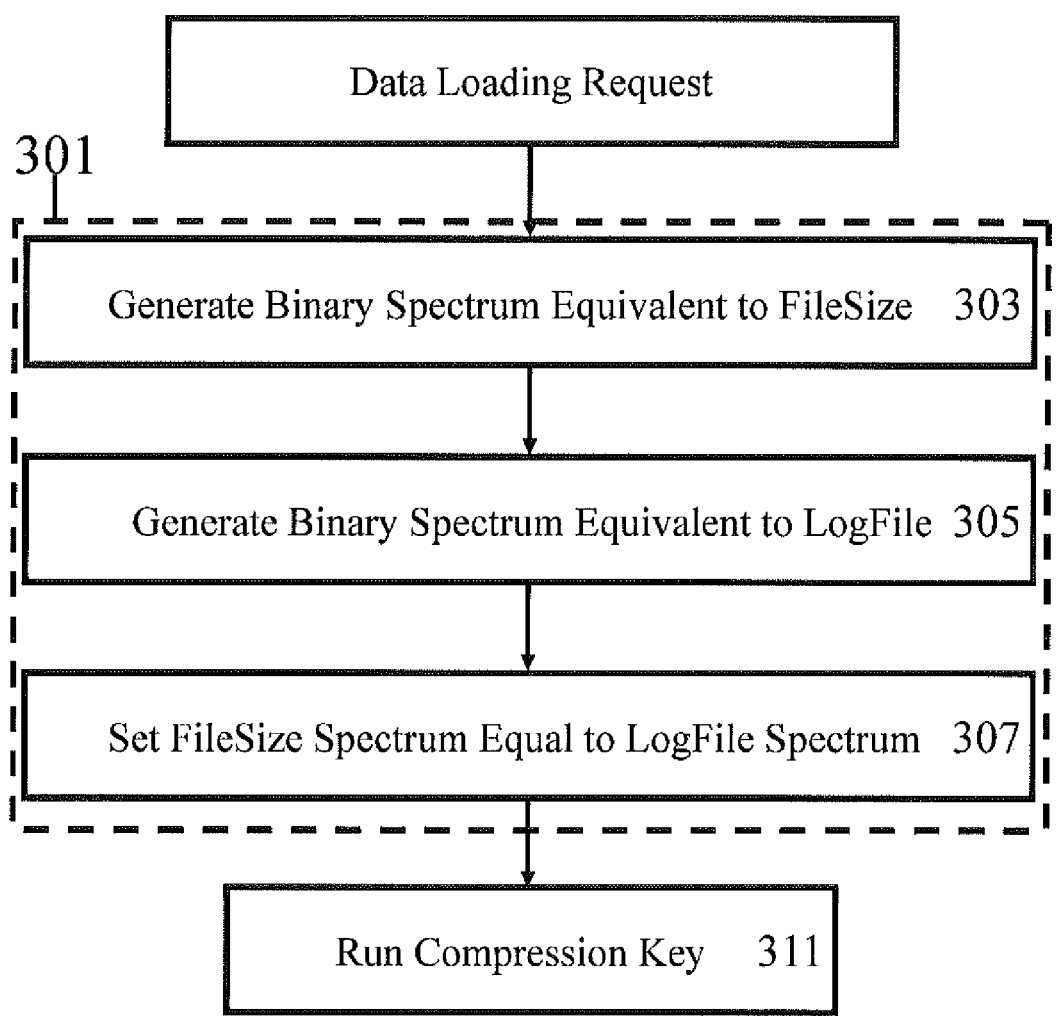
FIG. 3 shows a process for generating a compression key in accordance with an embodiment.

FIG. 3 is a detail of the compression key generation 105, 301. Because the disclosed compression method calls upon pre-generated compression keys, the manner in which the compression keys are generated is provided. It should be noted that the generation of compression keys operates on binary strings regardless of data type and makes use of preferably two bit packaging of binary data in conjunction with pattern recognition and the assigning of values in order to facilitate and simplify data compression.

The preferable method for generating compression keys begins with the generation of a binary spectrum equivalent to FileSize. Generating a binary spectrum for a particular FileSize 303 means that the system generates a spectrum of zeros of the same size as a given file size (also referred to herein as FileSize)—the binary spectrum is all the possibilities of zeros and ones for a file size of a given size. In the embodiment shown in in FIG. 3, a binary spectrum is also generated for LogFile 305 (the number generated in the equation 211) and the two are checked against one another as a checksum 307, as a file of a file size FileSize will have a corresponding LogFile value in accordance with the solving of equation 211 (alternate checksums may be employed). Step 307 serves to ensure that the tables generated for LogFile and FileSize align and relate to each other based on the solving of the equation 211. For instance, for a given FileSize, the system will check to ensure the appropriate LogFile is returned based off the simple equation 211 as a check. This may also be performed as a return of a ratio between the two.

Figure 4:
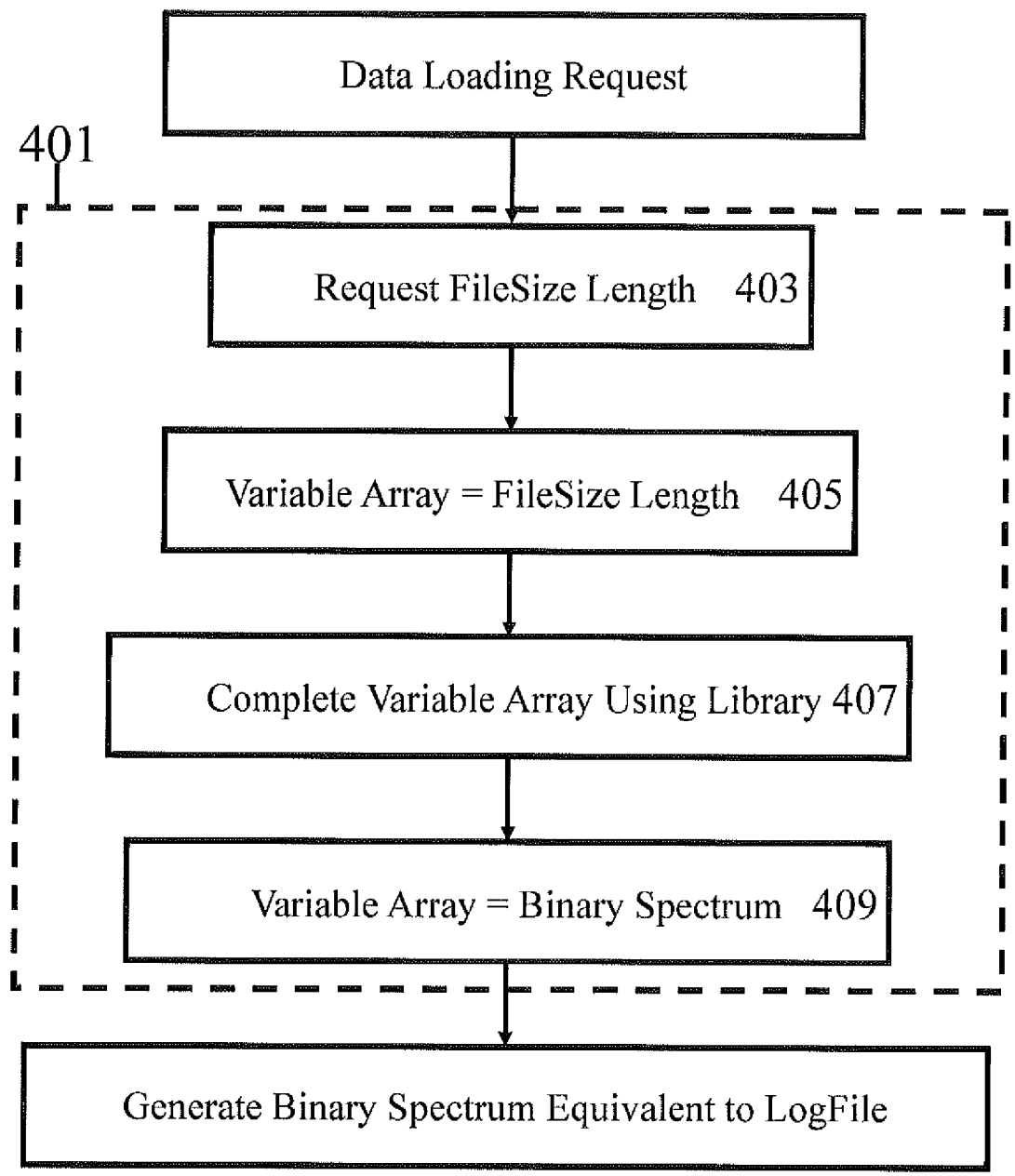
FIG. 4 shows a more detailed view of the generation of a binary spectrum for a file of a given file size in accordance with an embodiment.
Figure 5:
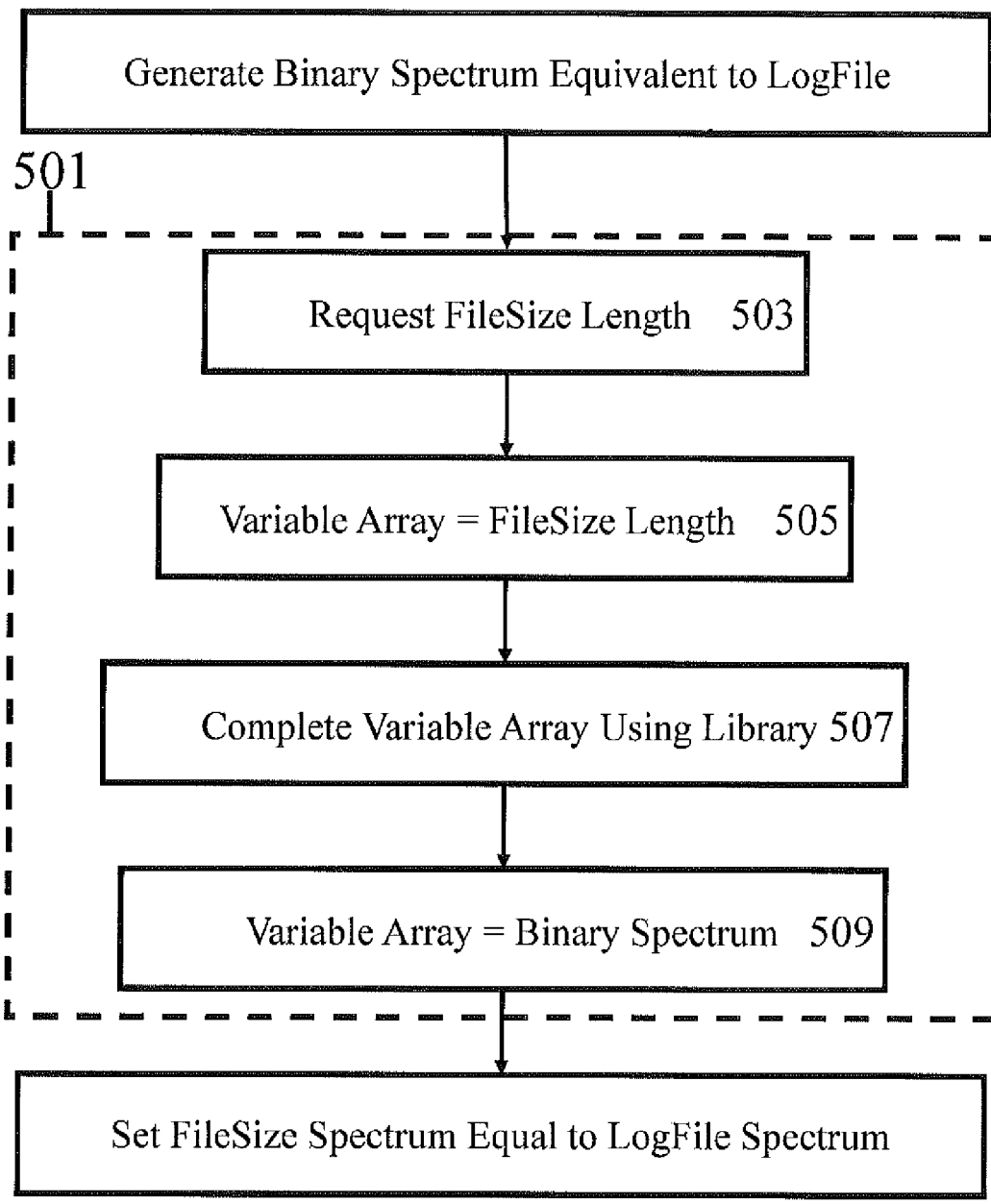
FIG. 5 shows a more detailed view of the generation of a binary spectrum for a file of a given Logfile in accordance with an embodiment.
Figure 6:
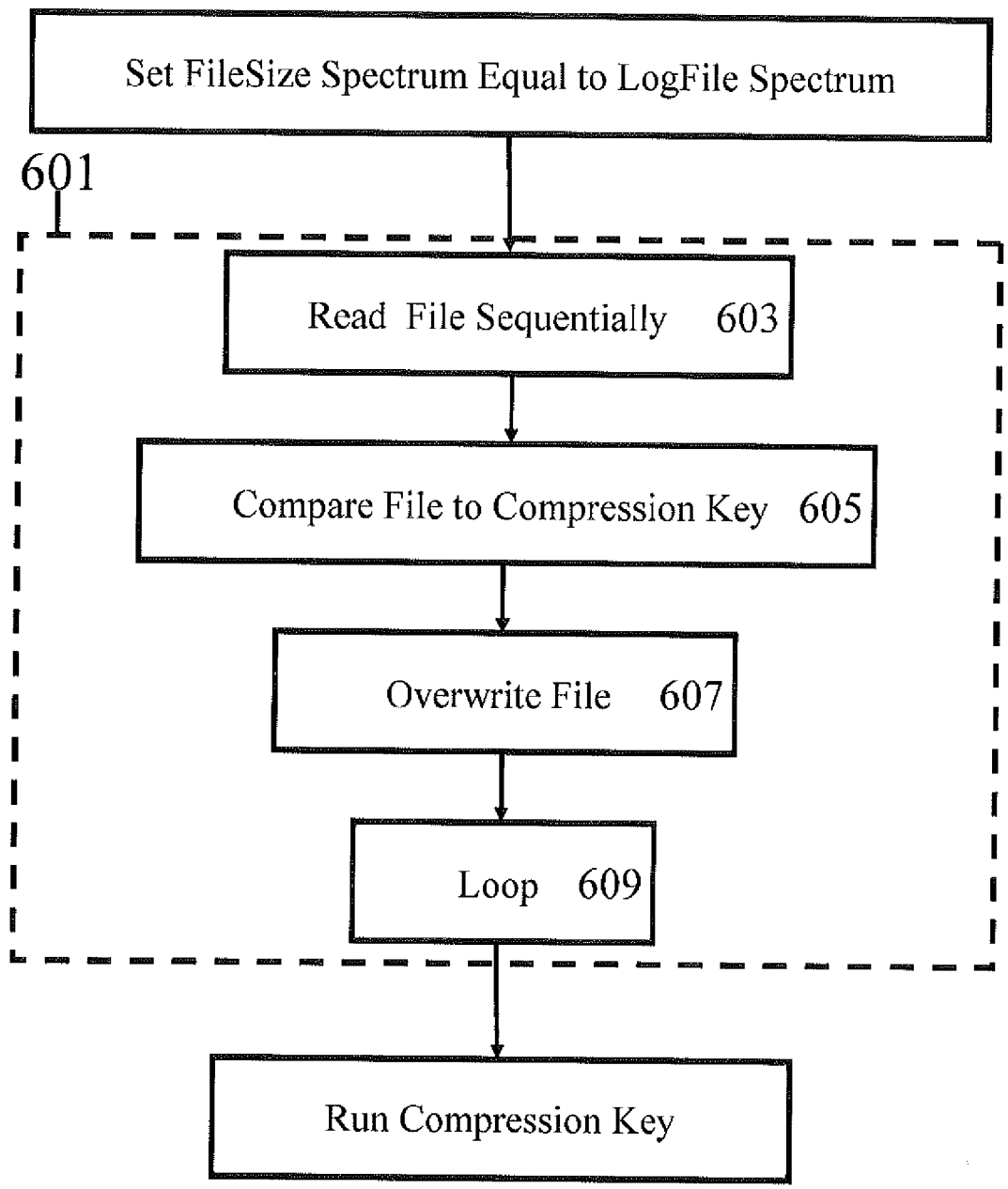
FIG. 6 shows a process for generation of the compression key in accordance with an embodiment.

FIG. 4 is the calculation of the binary possibilities for a particular file size, while FIG. 5 is the generation of the binary possibilities for Logfile. The generation of compression keys is further detailed in FIG. 7.

Turning first to FIG. 4, generation of the compression keys begins with a request for the size of a given file, FileSize, 403 and assignment of a variable array 405. This array will hold all of the possible combinations of zeros and ones for a file of a particular FileSize, and the combinations are placed there preferably using a standard available library 407. This array is also referred to as a table and represents the binary spectrum for a file of given FileSize. In the preferred embodiment, tables are prepared with files of all FileSizes. Also, although the preferred embodiment calls upon pre-generated compression key tables (these tables being also referred to simply as the compression key), compression keys may be performed at runtime or simultaneously with the compression. Thanks to the use of many tools in the compilation of the program, any program is rendered 'lighter' thanks to the beauty of C++ compilers. The use of real-time generation of compression key tables allows for the computer to simply launch a CPU powered comparison of the data (during compression or the compression file during decompression), which is a simple task.

FIG. 5 is the generation of the binary possibilities (the binary spectrum) for Logfile. This means that given a LogFile value, the system will be able to call up the compression key table for the corresponding FileSize. In other words, this is the corresponding compression key generation for keys to be used in decompression, that is, to decode a compressed file into the original. For a given Logfile, subprocess 501 may begin with the request of the corresponding FileSize 503 and calls upon the appropriate array for the given Filesize 505. Next, a lookup table is generated for the particular FileSize, for instance using a standard library known in the art 507, 509. The lookup table is preferably cached for later use.

In this disclosure, the terms "table," "compression key table" are tables associated with a specific FileSize. These tables are used for translating between an uncompressed file and its compression key (to be transmitted as its own binary string) and vice versa. Compression key refers in most embodiments as the value assigned to a packaged bit pattern which will be transmitted in binary as the compressed file. When used in a general sense, the term "compression key" may refer to the actual table called up for a file of a given FileSize or LogFile.

Figure 7:
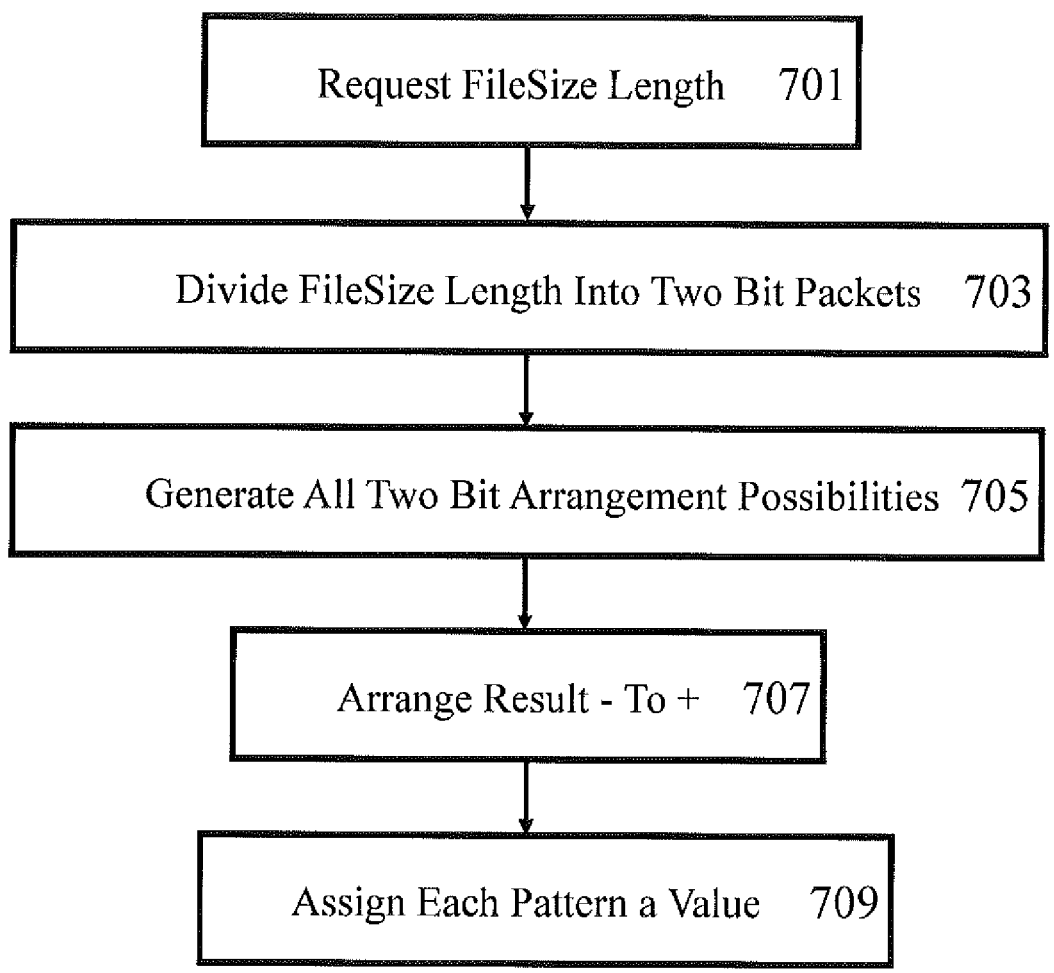
FIG. 7 depicts the generation of the compression key tables in accordance with an embodiment.
Figure 8:
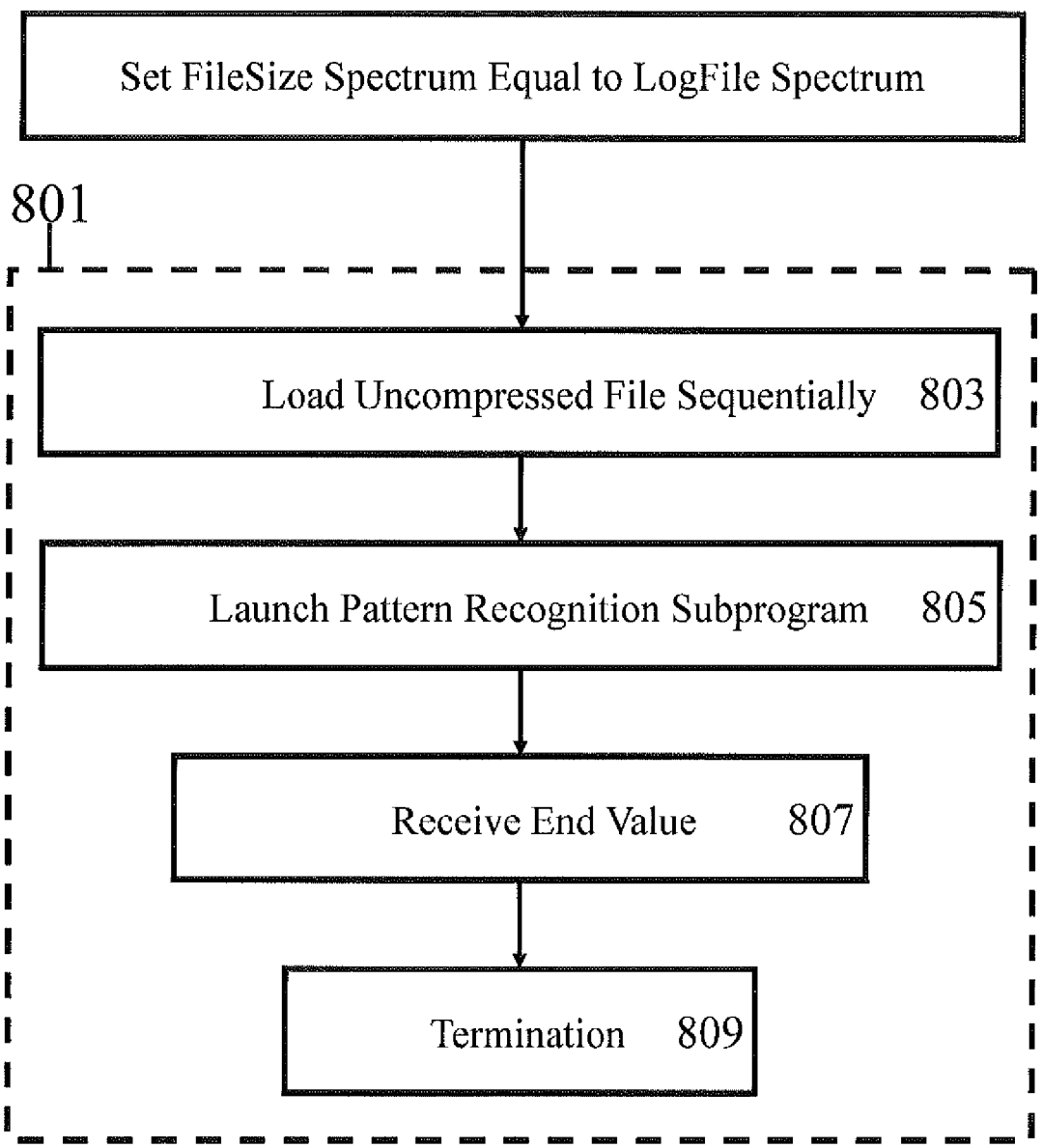
FIG. 8 shows the preferred process for running a compression key when a data file to is to be compressed or decompressed in accordance with an embodiment.

An alternate view of the compression key generation (which can also be seen as the lookup table generation) is shown in FIG. 7. For a File of a given FileSize, the length is first determined 701 and a value (referred to also as the packet value) is assigned to stand for each two-bit packet for a given binary string 703. From there, a binary spectrum is generated for all possible combinations of packet values for a file of a given FileSize. Preferably, the spectrum is then arranged from smallest to largest 707 and this spectrum is assigned another value 709. This value 709 shall be referred to as the compression value and may also be referred to herein as the compression key or code 709. This compression value may be attained by any predetermined convention, although preferred methods would result in the smallest number or value. For example, the operation of a formula or the sum or product of the packet values for a given line of binary code in the binary spectrum. For example, a one megabit sized file is broken into 500,000 two bit packets then that can be represented by a much smaller value. Another way of stating this is in terms of the on off flashes that are produced by an optical fiber to transmit data. In typical optical fibers, one wavelength of white light is used. The compression uses the probability that those light intensities were organized in that exact manner and assign a value in bits. This value will be much smaller, but still be transmittable by light flashes.

The tables (another term for the grids comprising the packaged binary arrangements and their assigned coefficients) may be pre-generated for a certain number of file sizes, or generated at runtime (of a compression or a decompression or both) and cached for later use. Note that the calling up and use of compression key tables (either pre-generated or generated at runtime) will not require undue resources of the machine; the compression key tables are self-generated, for example with self-replicating code, and preferably cached once run for outputting a different value to RAM for subsequent operations for various files of the same file size (but different binary arrangements). Also, one benefit to the tables being self-generated for files of all different file sizes, is that the data does not have to be set to a certain size prior to, for example, compression—the method will work for any file size.

FIG. 6 shows what is done when the system receives data to be compressed 601. This is preferably a real time generation of probability tables corresponding to a particular file size allowing then a CPU powered comparison of the data to the corresponding compression key. Once a data input is registered, per se, a program can compare it to a self-generated table to see the probability the binary is arranged in that certain way.

First there must be an input data, which is loaded 603. The data is then compared with the appropriate compression key

605. This comparison may be performed using a standard library for comparing the data with the appropriate compression key. The standard library may be built up in any language including but not limited to C++ or any tool in the Visual Studio pack, or any other language. Alternatively, a library in code can be an open source program available through the compiler and used widely. Compression keys to be used vary based on the input from a user as to the size of the data file to be compressed. Step 607 refers to the replacement of the data with the compressed file. Finally, the system may loop 609 in case there is a queue of additional files to be compressed, and if none, cancel and terminate.

FIG. 8 shows the running of the compression key which was generated at step 105, 801. First, the file is loaded and read 803. The loading step is external to the compression (or parallel decompression) and may be loading to the processing unit from RAM to the output back to the RAM. Various loading times may differ, but would not add more time to the actual compression, for instance if a file originates from a floppy drive or other location. Next, a pattern recognition subprogram is launched 805. This pattern recognition subprogram may be a single pattern recognition using a switch case (or other conditional statement) or linear algebra pattern recognition subprogram. This feature enables the system to identify the appropriate pattern of the binary to be compressed with the compression keys. If the compression key table already has an assigned value to the particular bit pattern, the value is assigned to the original file 807, which may be with a switch statement. This step is the Receive End Value step, 807, and is followed by a termination 809.

FIG. 9 shows a sample compression key table, for a file size of eight bits and is provided for the purpose of illustration only. The spectrums for all eight bit possibilities are shown in abbreviated form for purpose of space saving. Column B represents the binary packaged in the preferable two bit arrangement. Column C depicts a coefficient assigned to each two bit packet according to a chosen protocol, for instance integers, or characters, and the recasting of the string. In FIG. 9, this shows an example convention assigning the numerals 1-4 to stand for the two bit patterns 11, 01, 10, and 11, respectively.

It should be noted that due to the size limitations, an exceedingly small FileSize was selected for purpose of depicting the two bit partitioning and assignment of values to the same to represent original code—the compression method is optimal at much larger FileSizes because the compression key coefficients are subject to operations for producing a much shorter number (representing the final compressed file) than the sample coefficients shown here. This is because, in the case of an extremely short file, as shown in FIG. 9, the coefficients assigned cannot be simplified to result in a compression key that has fewer bits than the original four bit file. (Moreover, compression is not an issue for such small files, as they are already "compressed").

For much larger files however, these two bit coefficients would stand for each two bit sequence in the original file and the string of coefficients subjected to any simple operation or equation in order to assemble the string of coefficients to produce a value which will have a shorter bit sequence than the original file. The convention used for assigning this value (called the compression value) may be any convention such as a mathematical function or operation applied to the coefficient string. An example of such an operation is addition of the coefficients in the string to produce one number, or multiplication of same to produce a number, matrix, matrix multiplication, or scalar multiplication of the string of coefficients. Variations are possible, such as "nicking" a chosen function to be applied to the string of coefficients into multiple layers, by applying the function on top of another instance of the same function, which was applied to the original value. This will only affect compression time due to the fact that any of these functions will allow for the same 'value shrinking', but some will be more efficient in the computation and compression time depending on other factors, such as the length of the overall file.

The compression value itself may also be subject to a series of simplifications. The compression value may be also be a probability converted to integer form (for example $1/1,000,000,000$ could be converted into a nine digit number). The compression value, whether it is generated on a first simplification of the coefficient string, or subsequent simplifications, is then transmitted as binary code. This resulting binary code is much shorter than the original code, thus the compression. For this reason, the method disclosed actually improves its compression ratio as the FileSize increases.

FIGS. 10 and 11 are provided as another illustration of the method. At an encoding device 1201 or decoding device 1203, or both, FIG. 10 shows that compression key tables may be pre-generated. First for any given file length, a listing of all binary possibilities is generated 1001. This may be repeated for any File Size 1003. For a given binary spectrum that was generated in step 1001, the data is partitioned into two-bit packets. Each packet is assigned a value 1007, and each packaged pattern is assigned a compression key 1009. The assigning of the compression key itself is discussed elsewhere and may be any operation on the string of packets for a given binary possibility for a given file size.

The steps in FIG. 10 may be performed prior to or at the time of compression or decompression or both. When data is fed into the system 1101 (from input 1207), it is also partitioned into two bit partitions 1103. A pattern recognition subprogram is run to compare the packaged data with the compression key table that corresponds to files of the data's size 1105. The data is them replaced with its key 1107 and converted to binary for output 1209. Output may be transmitted through channel 1215 to decoding device 1203 at its input 1211. Likewise, the decoding device 1203 may similarly output the compressed file 1213 to another location.

Decompression: As mentioned previously, the system may include a decoding device 1203 for decompressing a compressed file. Upon receipt of the compressed file by a decoding device 1203, the system will read a compression header. The header file serves includes a log file, which is a record of how the data was compressed by the encoding device for the purpose of decoding/decompression; during decompression, the header will instruct the program to decode the compressed file such that the uncompressed data may be regenerated at the receiving location. The header includes a value "Logfile" which, for example is 500,000 if the original file to be compressed was a 1 Mbit file. This Logfile number serves as a record that the original data had a file size of 1 Mbits. This allows the decoding device to launch the appropriate lookup table without having to "recalculate" all the possible lookup tables for files of all sizes. The corresponding compression key table may be generated at this time or, if previously generated, pulled from cache.

The system described herein has been built and tested and used for the rapid transmission of compressed files of various file types. The system represents a useful simplification of compression systems of the past, which are inherently data-centric and complex. While known lossless compression methods use complex algorithms to analyze and shrink translated data, the disclosed system completely changes the data as seen by the machine. Because this system simply compresses raw binary regardless of the characters that the binary stands for, it does not require complex review of the actual data file to eliminate redundancy. As a result, it is a more efficient system. Furthermore, because the system uses compression keys to regenerate the exact code upon decompression, it is a lossless compression scheme—yet has compression ratios that most resemble lossy compression ratios; the system improves over lossless and lossy compression by maintaining the quality of lossless compression while keeping the compression ratio aspect of lossy compression. As explained above, this is preferably accomplished using two bit packaging, casting of a binary spectrum for each file size to create compression keys, and the simplification of the same into a value, and transmission of the value itself as a compressed binary bitstream. The system may be used on data that is already compressed into a compressed binary. In that regard, the system improves the traditional eight-bit binary system of data packaging for receipt and transmission, while at the same time is fully interoperable with existing systems/terminals which use binary.

System Architecture:

The system preferably comprises an encoding device 1201 for compressing data and decoding device 1203 for decompressing data in communication via channel 1215, 1205. The system may also include only encoding device 1201 or decoding device 1203. Channel 1205, 1215 is depicted as bidirectional in an embodiment because the two may be on one integrated system, or decompressed data in an embodiment may be returned to its original representation by an encoding device, which may be encoding device 1201 or another encoding device with the same architecture as encoding device 1201. Communication channel 1205, 1215 includes any suitable data communication structure, such as optical cable or wireless transfer systems. Alternatively, the system comprises a terminal having both an encoding and decoding device 1205, 1215 in communication with at least one other terminal having an encoding and decoding device.

Figure 13:
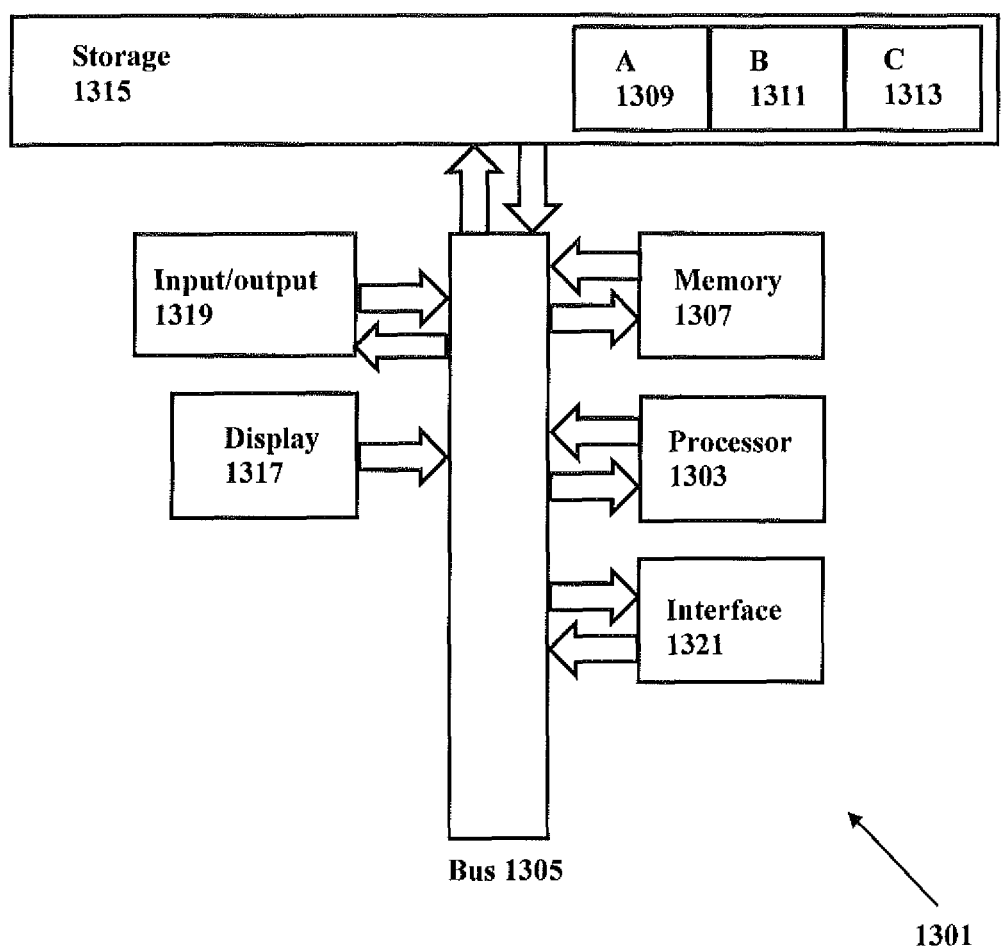
FIG. 13 shows an exemplar hardware architecture for the system in accordance with an embodiment.

A hardware embodiment of the system's encoding device 1201, decoding device 1203 or both is provided in FIG. 13. FIG. 13 depicts a hardware environment for performing one or more of the operations herein. These blocks or a subset of these blocks may be integrated into a device, such as a smartphone or tablet for performing the described methods. A computing device, which may be a network of computing devices, can be used to practice the embodiments described. The system preferably includes an encoding device and a decoding device in communication. The encoding device 1201 and decoding device 1203 may be combined or at separate terminals, the terminals each preferably having the componentry depicted in FIG. 13, for transmission of and receipt of compressed data. In one embodiment each of the encoding and decoding devices 1201, 1203 includes central processing unit (or processor) 1303 for executing the compression and decompression, memory, storage, and input/output devices, each of which are interconnected via a system bus that couples various system components including the memory to the processor. Modules can be configured to control the processor to process instructions for execution within the system. For instance, the system preferably comprises a chip including firmware (ex. Module A 1309) for performing the packaging of the binary code. Such executed instructions can implement one or more components of the system, for example, the binary packaging step and the running of the compression key when handling incoming data to be compressed or decompressed. Alternatively, these steps may be performed by separate modules, such as Module B storing instructions for performing the decompression 1311, and Module C 1313 for storing pre-generated compression key tables for use in translating between compressed and decompressed/original data. It should be noted that storage 1315 may be remote or local to the system. The processor is capable of processing instructions stored in memory or storage and may optionally display graphical information on an output device (such as the display 1317 of a user interface 1321 whereby a user may interact with the system to select files to be compressed or transmitted), said output device preferably comprising output devices associated with a user device used by a user, such as a tablet or smartphone.

Memory 1307 may include multiple different types of memory with different performance characteristics and may be read only memory and random access memory. The disclosure may operate on a computing device with more than one processor or on a group of networked computing devices, servers, or a combination of both. The system can include clients and servers. A client and server are usually remote and interact via a communication network and programmed to interact in a client/server relationship.

Processor 1303 may include any general purpose processor and a hardware module or software modules stored in storage, configured to control the processor as well as a special-purpose processor where program instructions are incorporated into the actual processor design. ARM processors and standard smart-device processors are adequate to handle the compression methods, with approximately less than 2% stress on the CPU. The system may also comprise a smaller device processor as well, powered by a microcontroller. The processor may be a completely self-contained computing system, containing multiple cores or processors, a bus, memory controller, cache, etc. A multi-core processor may be symmetric or asymmetric. The preferred system embodiment is presented as including individual functional blocks including functional blocks labeled as a "processor" or processor. The functions of one or more processors may be provided by a single shared processor or multiple processors, (The term "processor" should not be construed to refer exclusively to hardware capable of executing software, and as used herein is also referred to as a "processing device.") Illustrative embodiments may include microprocessor and/or digital signal processor hardware, read only memory for storing software performing the operations discussed above, and random access memory for storing results.

Bus 1305 may be any of several types of bus structures including a memory bus or memory controller, a peripheral bus, and a local bus using any of a variety of bus architectures. A basic input/output (BIOS) stored in read only memory or the like, may provide the basic routine that to assist in the transfer of information between elements within the computing device, such as during start-up. The computing system further includes storage such as a hard disk drive, a magnetic disk drive, an optical disk drive, tape drive or the like. Storage can include software modules, for example, for controlling the processor 1303. Other hardware or software modules are contemplated. The storage device is connected to the bus by a drive interface. Input data to be compressed may be fed from the storage device having a plurality of memories connected to corresponding subprocessors. The drives and the associated computer-readable storage media provide nonvolatile storage of computer-readable instructions, data structures, program modules and other data for the computing device.

Input/Output 1319 may be a connection to a communication channel 1205, 1215, for the receipt and transmission of data, respectively. This may be a wireless communication channel or a physical fiber, such as an optical cable. In the preferred embodiment, a file to be compressed is input into the system at in out 1319, then compressed according to the instructions in, for example Module A 1309, such instructions executed by processor 1307. Module A 1309 is used as an example, however, modules for containing instructions for performing compression, decompression or both may be stored as a combination of one or more modules, for example Modules A-C 1309, 1311, 1313 (or more modules for storing instructions or libraries of instructions).

In one embodiment, a hardware module that performs a particular function includes the software component stored in a non-transitory computer-readable medium in connection with the necessary hardware components, such as the processor, bus, display (optional), and so forth, to carry out the function. The system may include a user interface for allowing users to choose certain files to be compressed (not pictured), visible to a user via a display. As mentioned previously, the system may further comprise a display 1317 or interface 1321 or both whereby a user may interact with the system, for example, to select files to compress or transmit or both. In embodiments including a display, "display" refers to visually perceptible display on a display device (such as a networked computing device for example, an end user's device) resulting from a tangible computer filed stored in its memory. This may originate from across a network, such as the Internet, a wireless communication network, or a system of connected networked computers. The display includes devices upon which information can be displayed in a manner perceptible to a user, such as a touchpad or touchscreen display, a computer monitor, an LED display, and the like means known in the art for producing visually perceptible output. The basic components are known to those with skill in the art and appropriate variations are contemplated depending on the type of device; the term "computing device" refers to any device, such as a user device, with processing capability such that it can execute instructions, for example, tablets, smartphones, PC computers, servers, telephones, and other similar devices.

To enable user interaction with the computing device, an interface 1321 represents any number of input mechanisms, such as a microphone for speech, a touchscreen for gesture or graphical input, keyboard, mouse, motion input, speech, etc. An output device can also be one or more of a number of output mechanisms known to those of skill in the art. In some instances, multimodal systems enable a user to provide multiple types of input to communicate with the computing device. The communications interface generally governs and manages the user input and system output. There is no restriction on operating on any particular hardware configuration and the basic componentry here may easily be substituted for improved hardware or firmware arrangements as they are developed.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system can practice all or part of the disclosed methods and/or can operate according to instructions in the recited non-transitory computer-readable storage media. Such logical operations can be implemented as modules configured to control the processor to perform particular functions according to the programming of the module. For example, modules controlling the processor to perform particular steps or a series of steps, however additional or fewer modules may be used. These modules may be stored on the storage and loaded into random access memory or memory at runtime or may be stored as would be known in the art in other computer-readable memory locations.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, ROM, RAM, erasable programmable read-only memory (EPROM), electrically EPROM (EEPROM), magnet or optical cards, flash memory, or other type of media/machine-readable medium suitable for storing electronic instructions. Although the exemplary embodiment described herein employs the hard disk, storage, those skilled in the art appreciate that other types of computer-readable media may also be used in the exemplary operating environment. Non-transitory computer-readable storage media expressly exclude media such as energy, carrier signals, electromagnetic waves, and signals per se.

Variations in the above embodiments made by those skilled in the art of contemplated and made part of this disclosure. Although it would require additional power, the compressed code may be subjected to additional rounds of compression via the same method. This is because the compression method only requires a binary string (including a binary string of a compressed file) to compress the given string. In addition, the system may be used to compress the binary strings generated if compressed files which are generated by other known compression systems. Also, partitions other than two-bit may be used. Two bit partitioning was chosen as the preferred partition of the data because it is most efficient (meaning the highest compression ratios are attained using two-bit partitioning), however other sized partitions may be used. Two bit breakups are used due to the efficiency of calculation at runtime. The compression program simply has to assign a coefficient to each package and 'assemble' them into a single value that will be physically transferred.

Other modifications are contemplated. For instance, the flow charts provided are of example embodiments, but the same aims could be performed in similar manners. For instance, method steps could be performed by program instructions or firmware or both. Output could be handled by a single program itself or call upon libraries. A user interface may be added and itself modified to give a user various options for compressing data or fetching data. Firmware would be run off a main CPU or chips for encoding and decoding. Various power sources may be coupled with the system.

What is claimed is:

1. A method comprising:
    determining a file length;
    generating a binary spectrum, the binary spectrum comprising all possible combinations of binary code for a file of the file length;
    wherein for each possible combination of binary code, each combination is partitioned in packets, wherein each packet is assigned a predetermined value; and a string of each packet is generated for each combination;
    applying means for assembling each string and generating a second value to each string; and
    wherein at an encoding device for receiving data, the data received is compared with the binary spectrum and assigned the corresponding second value.

2. The method of claim 1, further comprising: transmitting the second value to another device.

3. The method of claim 2, wherein the second value is transmitted to a decoding device.

4. An apparatus, comprising:
   a processor adapted to execute one or more processes; and
   a memory configured to store a compression process executable by the processor, the compression process when executed operable to:
   receive an input of data;
   determine the data size;
   access a specific table according to the determination of the particular size of the data;
   perform one of either encoding or decoding of the data based on the specific table
   wherein the compression process when executed is further operable to:
      access the specific table for an input data, wherein the specific table further comprises:
         a binary spectrum comprising all the possible combinations of binary code for a data of the size of the input of data, wherein each possible combination of binary code is partitioned in packets of bits, wherein each bit packet is assigned a predetermined value; and
         a second value assigned to each of the possible combinations of binary code; wherein the second value assigned to a given possible combination of binary code is an assembly of each predetermined value for each bit packet in the given possible combination of binary code,
      wherein the compression process is configured to:
         compare the input data to the specific table,
         determine which of the possible combinations of binary code matches the binary code of the input data, and
         replace the input data with the corresponding second value.

5. The apparatus as in claim 4, wherein the assembly further comprises a value derived from the operation of a mathematical function on each predetermined value for each bit packet in the given possible combination of binary code.

6. The apparatus as in claim 5, wherein the packets are two bit packets.

7. The apparatus as in claim 5, wherein the compression process, when executed, is further operable to transmit the second value to another device.

8. The apparatus as in claim 5, wherein the compression process when executed is further operable to receive the second value from another device.

9. The apparatus as in claim 5, wherein the packets are n bit packets.

10. The apparatus as in claim 5, wherein the packets are n bit packets.

11. The apparatus as in claim 4, wherein the packets are n-bit packets.

12. The apparatus as in claim 4 further comprising a decoding device for receiving the second value, the decoding device further comprising:
    a processor;
    input for receiving the second value,
    memory; and
    storage for storing program instructions for accessing the specific table and replacing the second value with its corresponding combination of binary code.

13. The apparatus as in claim 4, wherein the compression process when executed is further operable to receive the second value from another device.

14. The apparatus as in claim 4, wherein the compression process, when executed, is further operable to transmit the second value to another device.

15. A decoding device for receiving the second value of claim 3 or 4, the decoding device further comprising:
    a processor;
    input for receiving the second value,
    memory; and
    storage for storing program instructions for accessing the specific table and replacing the second value with its corresponding combination of binary code.

* * * * *